(12) United States Patent
Zhang

(10) Patent No.: US 11,638,366 B2
(45) Date of Patent: Apr. 25, 2023

(54) WATER-COOLED RADIATOR INTERNALLY PROVIDED WITH SEMICONDUCTOR REFRIGERATION SYSTEM AND FAN

(71) Applicant: DONGGUAN BINGDIAN INTELLIGENT SCIENCE & TECHNOLOGY CO., LTD., Dongguan (CN)

(72) Inventor: Fengqi Zhang, Tongliao (CN)

(73) Assignee: DONGGUAN BINGDIAN INTELLIGENT SCIENCE & TECHNOLOGY CO, LTD., Dongguan (CN)

( * ) Notice: Subject to any disclaimer, the term of this patent is extended or adjusted under 35 U.S.C. 154(b) by 92 days.

(21) Appl. No.: 17/482,440

(22) Filed: Sep. 23, 2021

(65) Prior Publication Data

US 2022/0015263 A1 Jan. 13, 2022

(51) Int. Cl.
*H05K 7/20* (2006.01)
*F25B 21/02* (2006.01)
*G06F 1/20* (2006.01)

(52) U.S. Cl.
CPC ......... *H05K 7/20272* (2013.01); *F25B 21/02* (2013.01); *H05K 7/20136* (2013.01); *H05K 7/20263* (2013.01); *F25B 2321/023* (2013.01); *F25B 2321/0252* (2013.01); *G06F 1/20* (2013.01); *G06F 2200/201* (2013.01); *H05K 7/20145* (2013.01); *H05K 7/20154* (2013.01); *H05K 7/20254* (2013.01)

(58) Field of Classification Search
CPC .......... H05K 7/20136; H05K 7/20145; H05K 7/20154; H05K 7/20254; H05K 7/20263; G06F 1/20; G06F 2200/201
See application file for complete search history.

(56) References Cited

U.S. PATENT DOCUMENTS

| 6,343,478 B1 * | 2/2002 | Chang | H01L 23/473 |
| | | | 257/E23.098 |
| 2005/0230086 A1 * | 10/2005 | Wang | H01L 23/473 |
| | | | 257/E23.098 |

* cited by examiner

*Primary Examiner* — Lionel Nouketcha
(74) *Attorney, Agent, or Firm* — Nitin Kaushik

(57) ABSTRACT

The present invention provides a water-cooled radiator internally provided with a semiconductor refrigeration system and a fan, the water-cooled radiator comprising: a radiation fin, a water tank structure, water-cooled pipes, a water pump, a water-cooled gear, a semiconductor refrigeration structure and a radiator fan assembly, wherein the radiation fin, the water tank structure, the semiconductor refrigeration structure and the radiator fan assembly are connected into an integrated structure. By means of the semiconductor refrigeration structure, the water temperature of a water storage tank can be rapidly lowered, and the radiator fan assembly can dissipate the heat of and cool a semiconductor, and can dissipate the heat of and cool electronic components around a main board.

10 Claims, 7 Drawing Sheets

WATER-COOLED RADIATOR INTERNALLY PROVIDED WITH SEMICONDUCTOR REFRIGERATION SYSTEM AND FAN

TECHNICAL FIELD

The present invention relates to the technical field of radiators, in particular to a water-cooled radiator internally provided with a semiconductor refrigeration system and a fan.

BACKGROUND

A CPU water-cooled radiator involves the use of liquid driven by a pump to circulate forcefully to take away the heat of the radiator, which has the advantages such as quietness, stable cooling, and less dependence on the environment compared with an air-cooled radiator.

The heat dissipation performance of a water-cooled radiator is directly proportional to the flow rate of radiator liquid (water or other liquid) therein, and the flow rate of refrigeration fluid is further related to the power of a water pump in a refrigeration system. Moreover, the heat capacity of water is high, which makes the water-cooled refrigeration system have good heat load capacity that is about 5 times that of an air-cooled system, directly benefiting upon a very flat CPU operating temperature curve. For example, a system that uses an air-cooled radiator may have a temperature thermal peak in a short period of time when running programs with a large CPU load, or may exceed the CPU alert temperature, whereas a water-cooled radiator system has relatively much smaller thermal fluctuations because of a large heat capacity.

However, there is still much room for improvement in the heat dissipation effect of existing water-cooled radiators. A new radiator combining water-cooling and air-cooling with a faster refrigeration system is needed to improve the heat dissipation efficiency of the radiator.

SUMMARY

The present invention provides a water-cooled radiator internally provided with a semiconductor refrigeration system and a fan. The problem of poor heat dissipation effect of existing radiators is solved by means of technical transformation of the existing water-cooled radiators.

In order to solve the technical problem mentioned above, the present invention specifically adopts the following technical solution:

a water-cooled radiator internally provided with a semiconductor refrigeration system and a fan comprises a radiation fin, a water tank structure, water-cooled pipes, a water pump, a water-cooled gear, a semiconductor refrigeration structure and a radiator fan assembly, wherein the radiation fin is stuck close to the outer end surface of a CPU; the water tank structure is stuck close to the side, away from the CPU, of the radiation fin; the water tank structure is filled with coolant; the water tank structure is provided with a water inlet and a water outlet, and the water inlet and the water outlet are connected to the water-cooled gear by means of the water-cooled pipes; the water-cooled pipes outside the water tank structure are further provided with the water pump; and the water pump is used to form a water circulation with the coolant between the water tank structure and the water-cooled gear; and the semiconductor refrigeration structure is further fixedly installed on the side, away from the radiation fin, of the water tank structure; the radiator fan assembly is further arranged under the semiconductor refrigeration structure; and the radiation fin, the water tank structure, the semiconductor refrigeration structure and the radiator fan assembly are installed and connected from top to bottom to form an integrated structure.

Preferably, the water-cooled pipes comprise a water inlet pipe, a water outlet pipe and adapters, and the water tank structure is provided with a water inlet and a water outlet, wherein the water inlet pipe is connected to the water inlet of the water tank structure; the water outlet pipe is connected to the water outlet of the water tank structure; the adapters are arranged both between the water inlet pipe and the water inlet and between the water outlet pipe and the water outlet; and the water pump is disposed on the water inlet pipe or the water outlet pipe.

Preferably, pipe sleeves are sleeved all outside the water inlet pipe, the water outlet pipe and the adapters.

Preferably, a water pump vibration-absorbing sleeve is further sleeved outside the water pump.

Preferably, the water tank structure comprises a waterway cover plate and a main body bottom shell, wherein a water inlet tank and water outlet tanks are arranged in the main body bottom shell; the water inlet tank is disposed in the middle of the main body bottom shell, and the water outlet tanks are disposed on the left and right sides of the water inlet tank and communicate with each other; the water inlet tank communicates with the water inlet, and the water outlet tanks communicate with the water outlet; the waterway cover plate is installed above the main body bottom shell in a closed manner; a water inlet channel is formed in the middle of the waterway cover plate, and water outlet channels are formed on the left and right sides of the waterway cover plate; the water inlet channel and the water inlet tank are arranged correspondingly, and the water outlet channels and the water outlet tanks are arranged correspondingly; and the side, away from the main body bottom shell, of the waterway cover plate abuts against the radiation fin.

Preferably, a waterway sealing ring is sleeved on the outer periphery of the abutting surface between the waterway cover plate and the radiation fin.

Preferably, the semiconductor refrigeration structure comprises a cooling conductive copper plate, an isolation sealing ring, a semiconductor refrigerator, an EVA foam and a heat dissipation aluminum plate, wherein the cooling conductive copper plate is disposed on the bottom surface of the water tank structure; the outer periphery of the cooling conductive copper plate is sleeved with the isolation sealing ring; the side, away from the water tank structure, of the cooling conductive copper plate is provided with the semiconductor refrigerator; the semiconductor refrigerator abuts against the cooling conductive copper plate and the outer periphery of the semiconductor refrigerator is sleeved with the EVA foam; the heat dissipation aluminum plate is disposed on the bottom surfaces of the semiconductor refrigerator and the EVA foam; and the radiator fan assembly is arranged under the heat dissipation aluminum plate.

Preferably, the side, away from the semiconductor refrigerator, of the heat dissipation aluminum plate is provided with heat dissipation flaps; a water barrier wall and a water return hole are arranged between each adjacent heat dissipation flaps, and the water barrier walls are arranged at the edge of the heat dissipation aluminum plate; the bottom of the water tank structure is provided with a circle of return water storage tank, and the circle of return water storage tank is disposed at the outer periphery of the EVA foam; and the water return holes correspond to the return water storage tank above the heat dissipation aluminum plate in position.

Preferably, the radiator fan assembly comprises a fan base, a fan and an upper cover, wherein the fan is installed in the upper cover; the annular fan base is installed above the upper cover; the fan base is sleeved on the outside of the fan and the semiconductor refrigeration structure and is fixedly connected to the bottom surface of the water tank structure; the upper cover is provided with air inlets, and the outer wall of the fan base is provided with air outlets.

Preferably, a ventilation iron mesh is arranged at the air inlets of the upper cover, ventilation slots are formed on the outer wall of the fan base at equal intervals, and the ventilation slots form the air outlets.

Compared with the prior art, the present invention has the following beneficial effects:

the heat dissipated by the CPU is transferred to the water tank by means of the radiation fin and is absorbed by the coolant in the water tank, the coolant in the water tank is pumped out by means of the water pump to the water-cooled gear for heat dissipation, and then the coolant is sent back to the water tank for circularly refrigerating the CPU.

1. According to the present invention, the water pump is arranged outside the water tank and externally disposed on the external water-cooled pipes. Compared with the traditional water-cooled devices with water pumps arranged inside water tanks, the storage space of the water tanks is increased, and therefore the refrigeration effect is improved.

2. According to the present invention, the radiation fin is stuck close to the outer end surface of a CPU, and the bottom surface of the radiation fin is provided with a water tank structure. The radiation fin is flushed by means of a water inlet channel disposed in the middle of the water tank structure, and water flows out toward both sides for heat dissipation, thus the heat dissipation effect achieved by such flow direction is better than the heat dissipation effect achieved by traditional structures.

3. According to the present invention, the lower end of the water tank structure is provided with a semiconductor refrigeration structure, which can rapidly lower the water temperature of a main body water storage tank, so that the temperature of the main board CPU is greatly lowered more effectively on the basis of the original refrigeration system.

4. According to the present invention, a radiator fan assembly is arranged under the semiconductor refrigeration structure, thus the heat generated by semiconductor refrigeration can be dissipated for cooling. And the fan can blow out the air all around from the inside of the water-cooled gear to the outside to dissipate heat of and cool various electronic components such as an MOS tube and a memory bank around the main board CPU when simultaneously dissipating heat of and cooling the semiconductor refrigerator.

Figure 1:
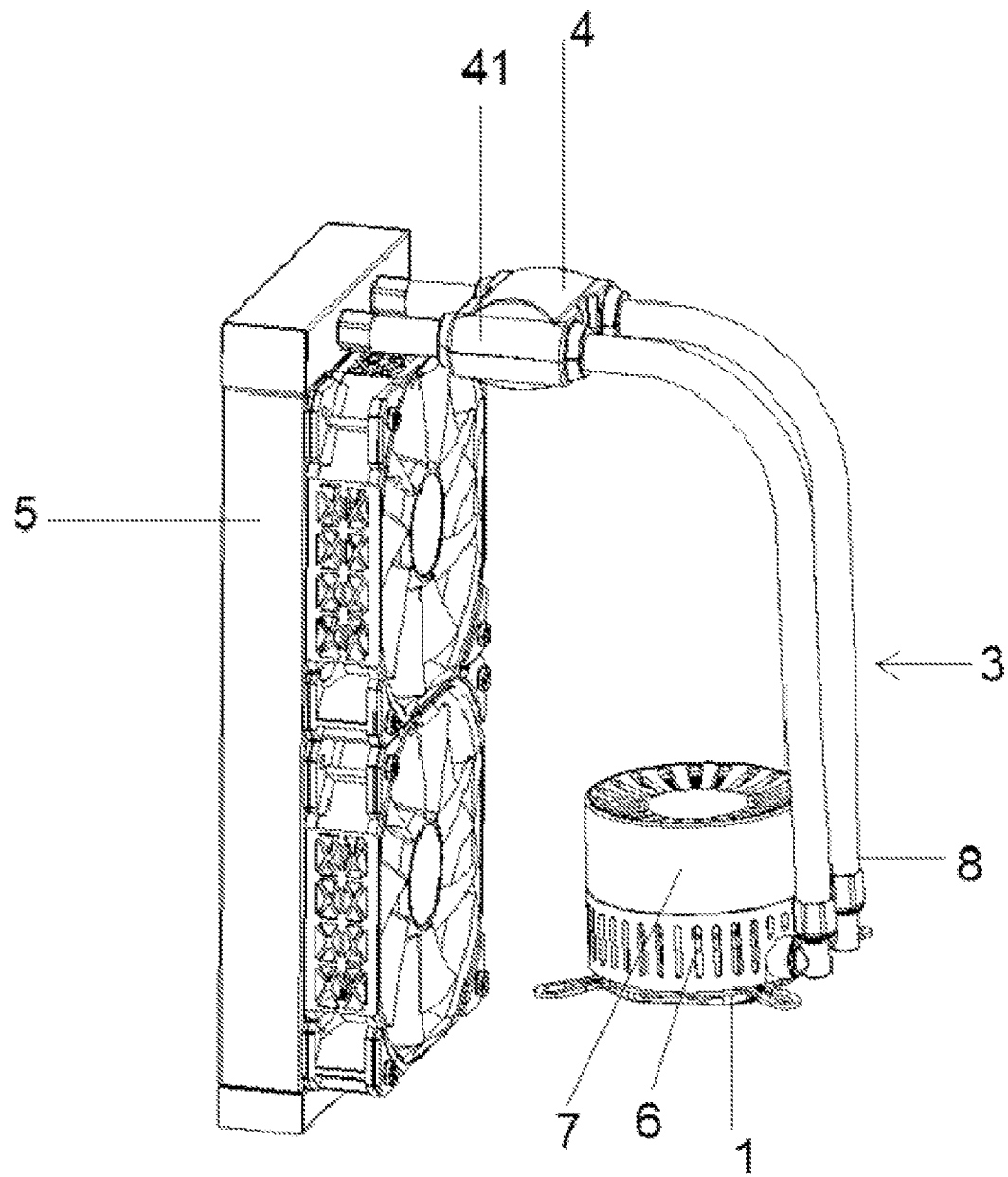
FIG. 1 is a schematic diagram of the assembly structure of the present invention.

Description of symbols: radiation fin 1, water tank structure 2, waterway cover plate 21, water inlet channel 211, water outlet channel 212, waterway sealing ring 213, main body bottom shell 22, water inlet tank 221, water outlet tank 222, return water storage tank 223, water inlet 23, water outlet 24, water-cooled pipe 3, water inlet pipe 31, water outlet pipe 32, adapter 33, water pump 4, water pump vibration-absorbing sleeve 41, water-cooled gear 5, semiconductor refrigeration structure 6, cooling conductive copper plate 61, isolation sealing ring 62, semiconductor refrigerator 63, EVA foam 64, heat dissipation aluminum plate 65, heat dissipation flap 651, water barrier wall 652, water return hole 653, radiator fan assembly 7, fan base 71, air outlet 711, fan 72, upper cover 73, air inlet 731, ventilation iron mesh 732, and pipe sleeve 8.

DETAILED DESCRIPTION OF EMBODIMENTS

The specific content of the present invention will be described in detail below with reference to the accompanying drawings and embodiments.

Figure 2:
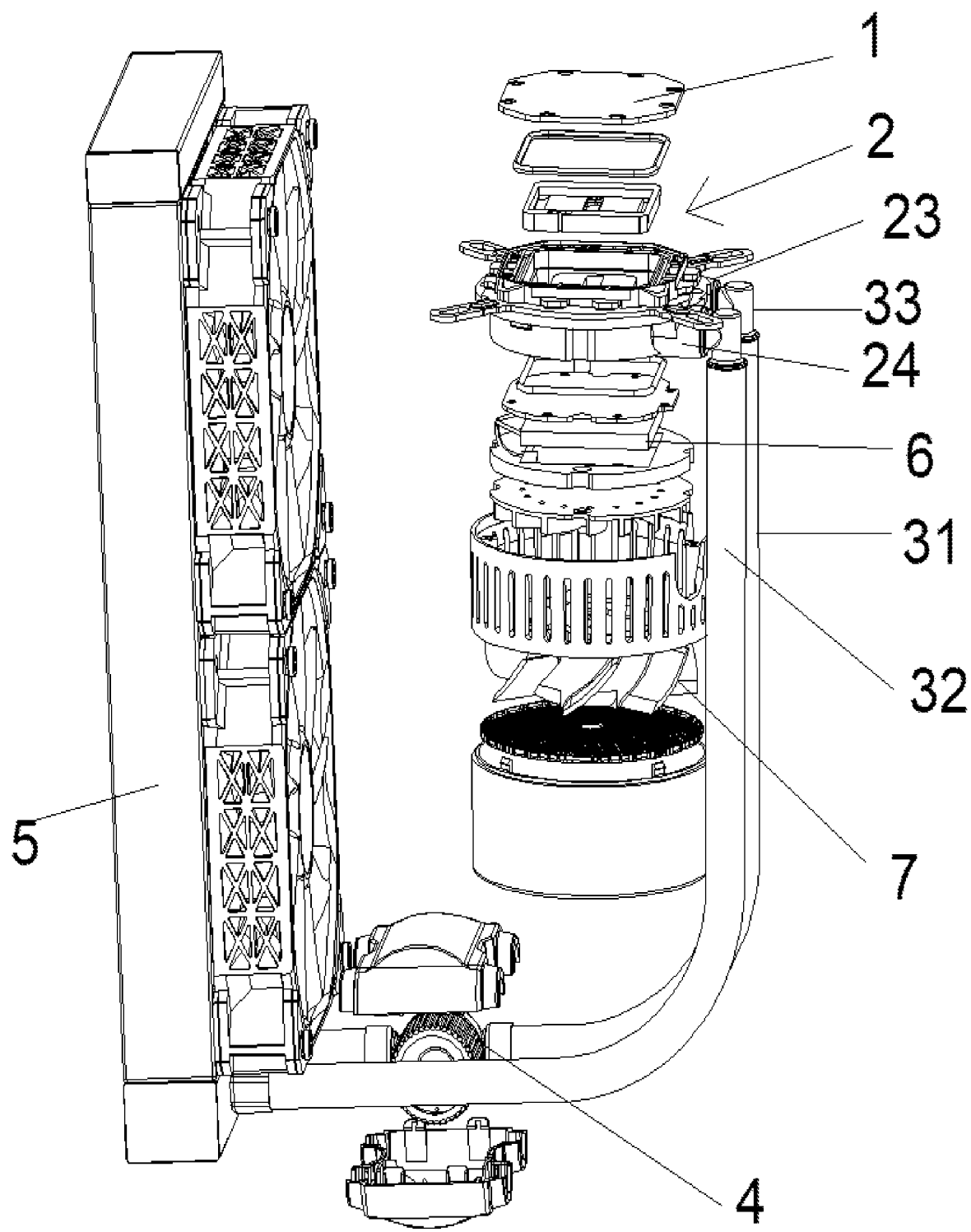
FIG. 2 is an explosive schematic diagram of the present invention.
Figure 3:
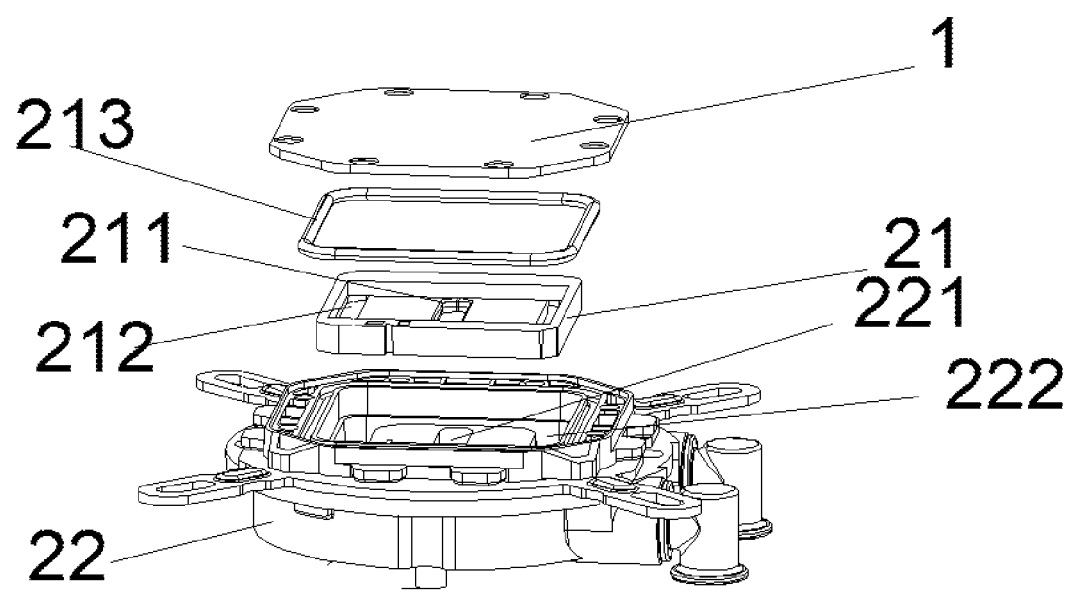
FIG. 3 is a schematic diagram of the water tank structure of the present invention.
Figure 4:
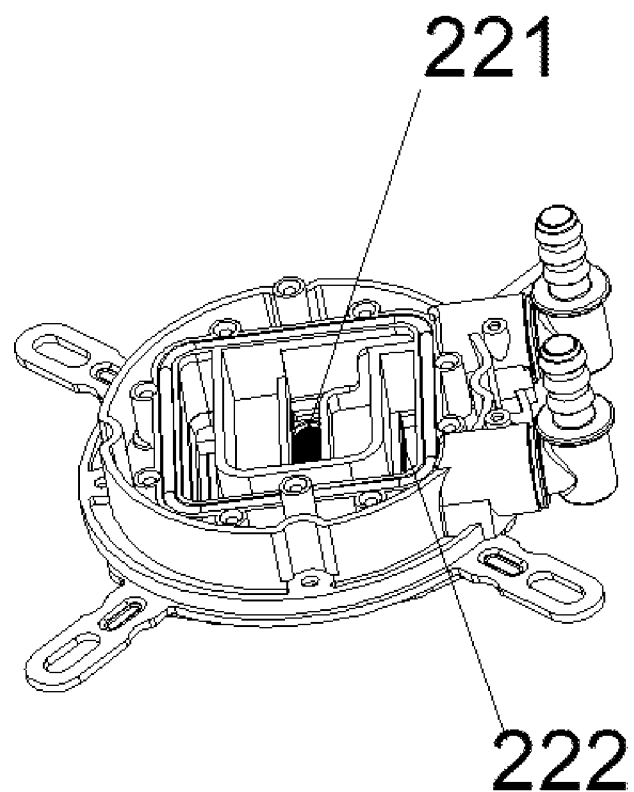
FIG. 4 is an interior schematic diagram of the main body bottom shell of the present invention.
Figure 5:
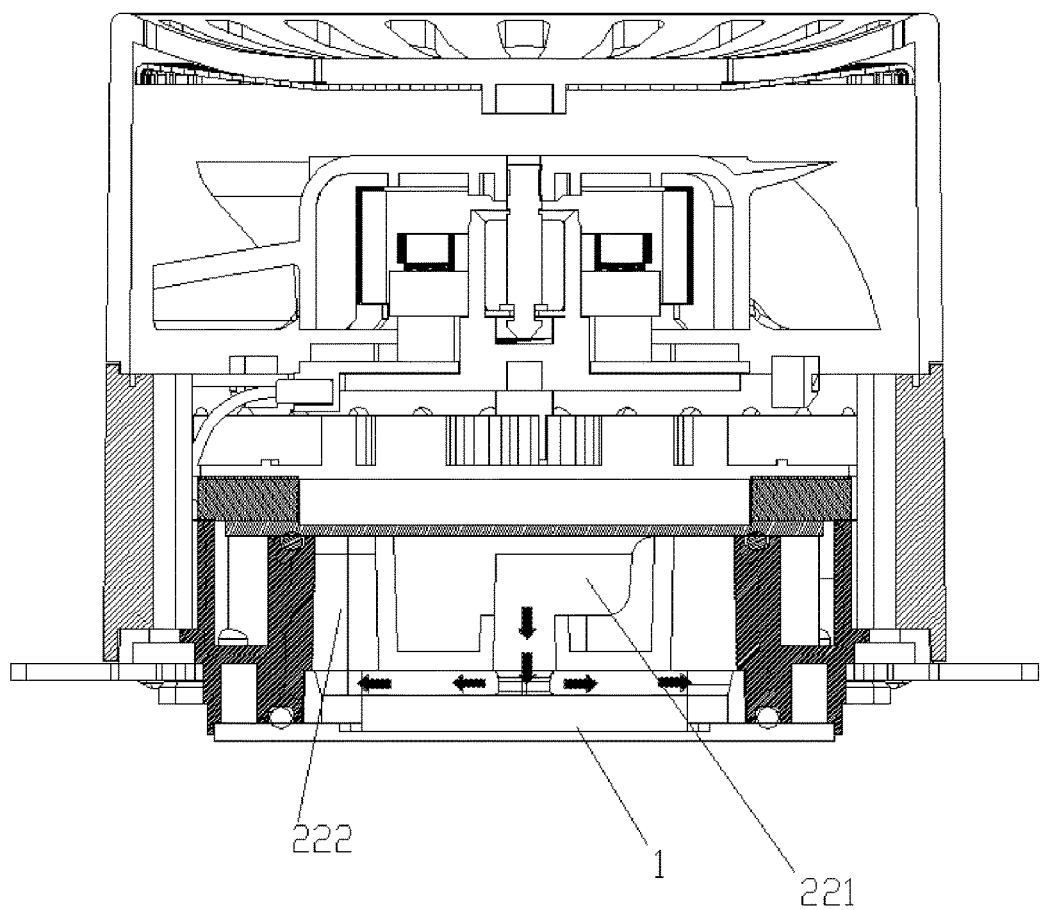
FIG. 5 is a flow direction schematic diagram of the coolant in the water tank structure of the present invention.
Figure 6:
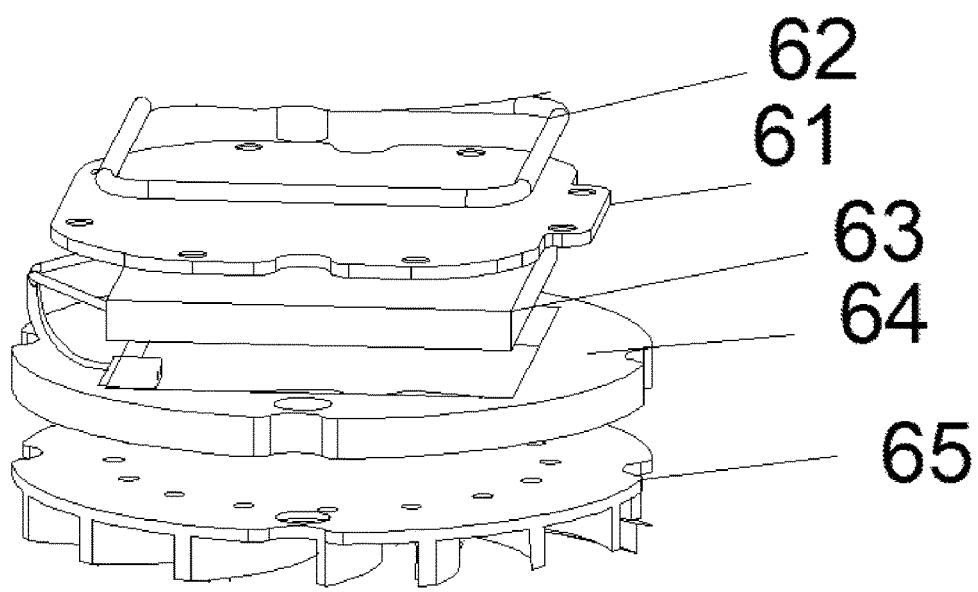
FIG. 6 is a schematic diagram of the semiconductor refrigeration structure of the present invention.
Figure 7:
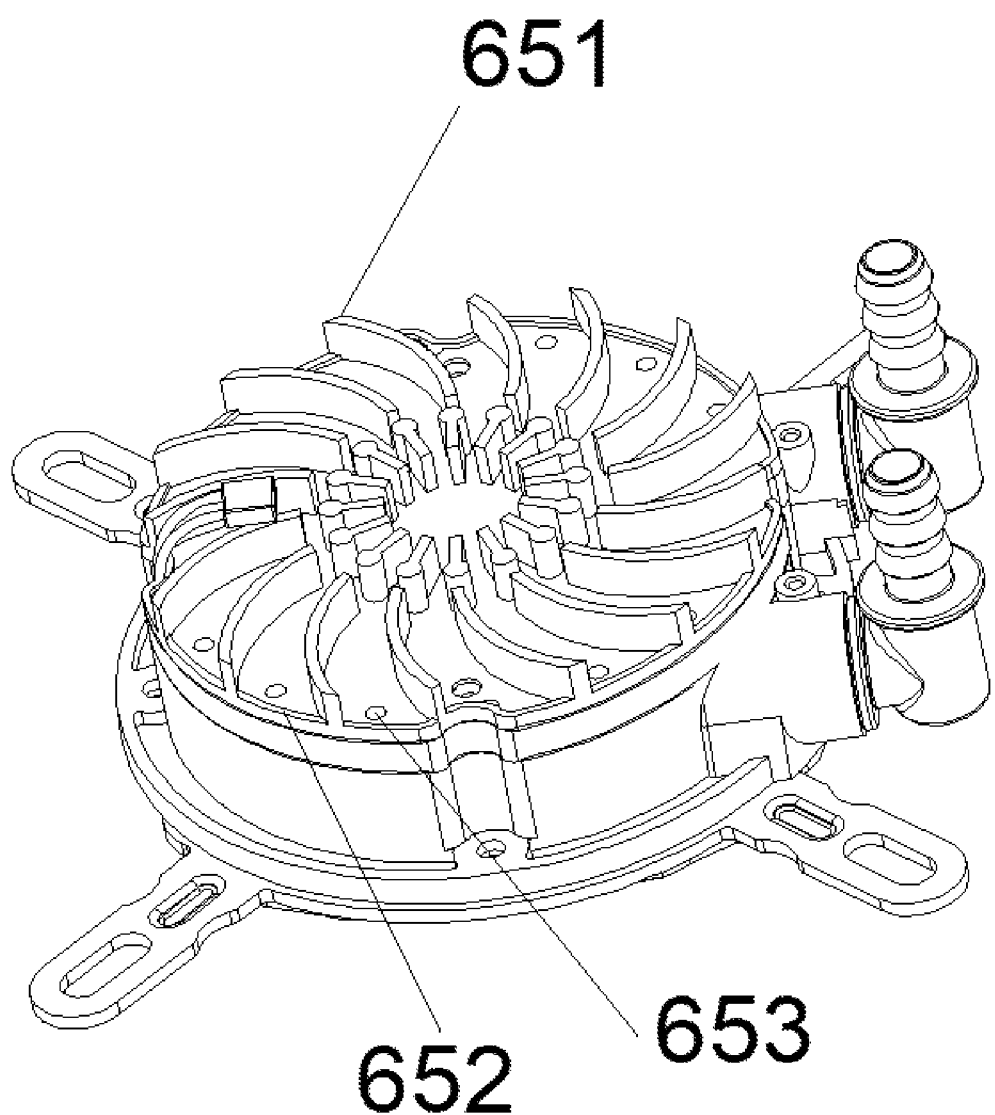
FIG. 7 is a schematic diagram of the heat dissipation aluminum plate of the present invention.
Figure 8:
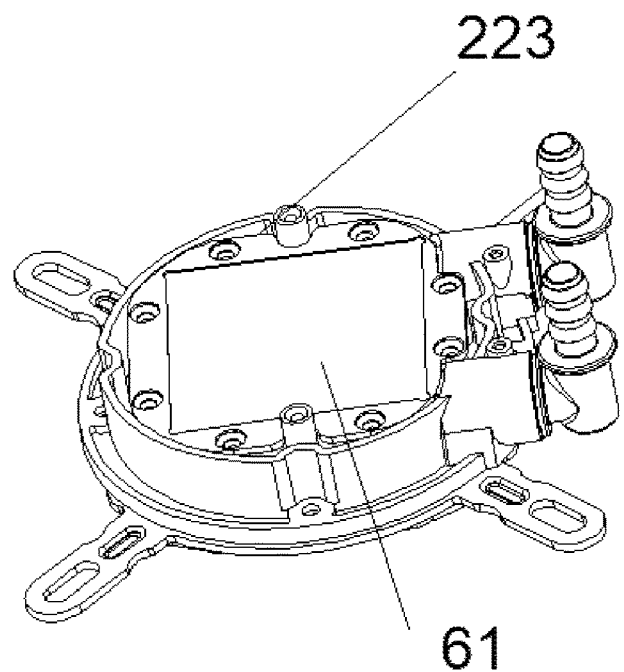
FIG. 8 is a location schematic diagram of the return water storage tank of the present invention.
Figure 9:
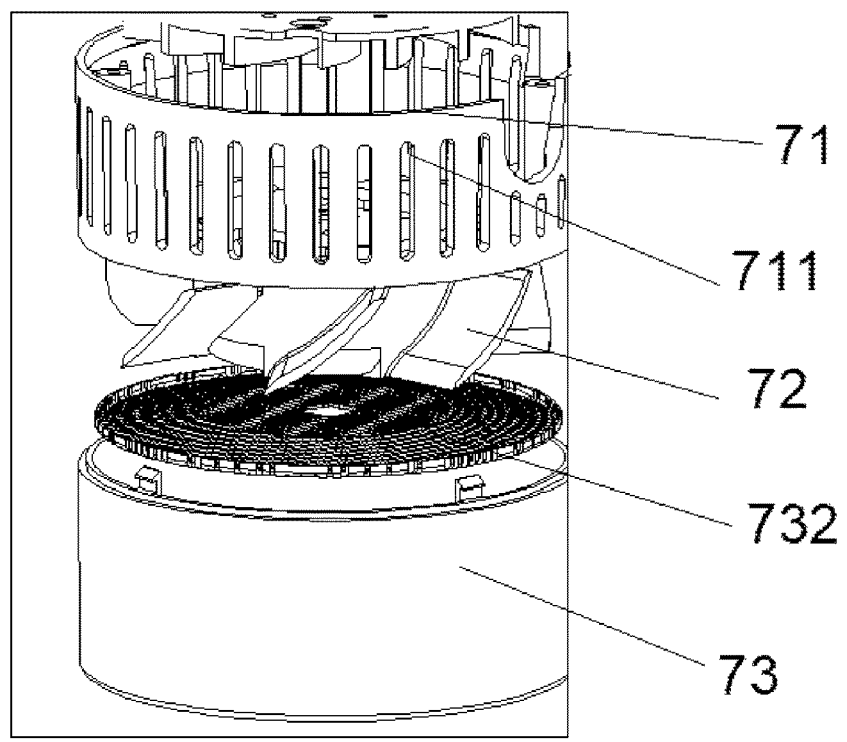
FIG. 9 is a schematic diagram of the radiator fan assembly of the present invention.
Figure 10:
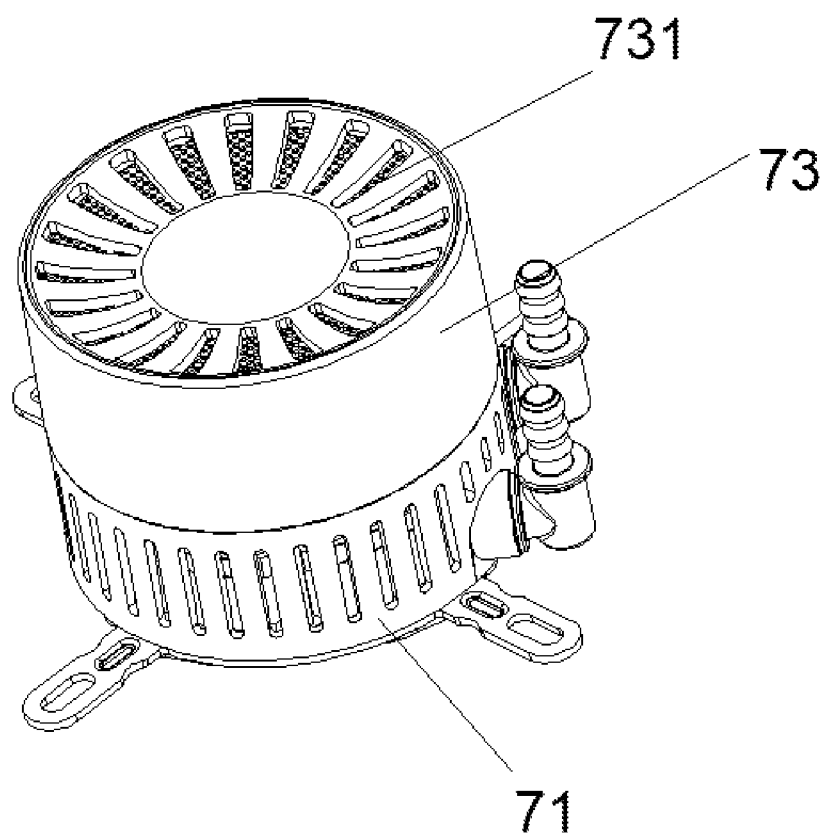
FIG. 10 is an installation diagram of the radiator fan assembly of the present invention.

As shown in FIGS. 1-10, the embodiments provide a water-cooled radiator internally provided with a semiconductor refrigeration system and a fan, the water-cooled radiator comprising: a radiation fin 1, a water tank structure 2, water-cooled pipes 3, a water pump 4, a water-cooled gear 5, a semiconductor refrigeration structure 6 and a radiator fan assembly 7, wherein the radiation fin 1 is stuck close to the outer end surface of a CPU; the water tank structure 2 is stuck close to the side, away from the CPU, of the radiation fin 1; the water tank structure 2 is filled with coolant; the water tank structure 2 is provided with a water inlet 23 and a water outlet 24, and the water inlet 23 and the water outlet 24 are connected to the water-cooled gear 5 by means of the water-cooled pipes 3; the water-cooled pipes 3 outside the water tank structure 2 are further provided with the water pump 4; and the water pump 4 is used to form a water circulation with the coolant between the water tank structure 2 and the water-cooled gear 5; and the semiconductor refrigeration structure 6 is further fixedly installed on the side, away from the radiation fin 1, of the water tank structure 2; the radiator fan assembly 7 is further arranged under the semiconductor refrigeration structure 6; and the radiation fin 1, the water tank structure 2, the semiconductor refrigeration structure and the radiator fan assembly 7 are installed and connected from top to bottom to form an integrated structure.

The radiation fin 1 lowers the temperature of the CPU by means of micro-channel decomposition.

Further, the water-cooled pipes 3 comprise a water inlet pipe 31, a water outlet pipe 32 and adapters 33, and the water tank structure 2 is provided with a water inlet 23 and a water outlet 24, wherein the water inlet pipe 31 is connected to the water inlet 23 of the water tank structure 2, and the water outlet pipe 32 is connected to the water outlet 24 of the water tank structure 2; the adapters 33 are arranged both between the water inlet pipe 31 and the water inlet 23 and between the water outlet pipe 32 and the water outlet 24; and the water pump 4 is disposed on the water inlet pipe 31 or the water outlet pipe 32.

Further, pipe sleeves 8 are sleeved all outside the water inlet pipe 31, the water outlet pipe 32 and the adapters 33. The parts, pipe-connected to a radiator gear, the water pump 4 and the adapters 33, of the water-cooled pipes 3 are all sleeved with the pipe sleeves 8, so that connection structures thereof are firmer and more reliable to lower the risk of liquid leakage.

Further, a water pump vibration-absorbing sleeve 41 is further sleeved outside the water pump 4 to prevent the vibration with products brought by the operation of the water pump 4 and avoid noise caused thereby.

Further, the water tank structure 2 comprises a waterway cover plate 21 and a main body bottom shell 22, wherein a water inlet tank 221 and water outlet tanks 222 are arranged in the main body bottom shell 22; the water inlet tank 221 is disposed in the middle of the main body bottom shell 22, and the water outlet tanks 222 are disposed on the left and right sides of the water inlet tank 221 and communicate with each other; the water inlet tank 221 communicates with the water inlet 23, and the water outlet tanks 222 communicate with the water outlet 24; the waterway cover plate 21 is installed above the main body bottom shell 22 in a closed manner; a water inlet channel 211 is formed in the middle of the waterway cover plate 21, and water outlet channels 212 are formed on the left and right sides of the waterway cover plate 21; the water inlet channel 211 and the water inlet tank 221 are arranged correspondingly, and the water outlet channels 212 and the water outlet tanks 222 are arranged correspondingly; and the side, away from the main body bottom shell 22, of the waterway cover plate 21 abuts against the radiation fin 1. The radiation fin 1 is flushed by means of the water inlet channel 211 formed in the middle of the water tank structure 2, and water flows out toward both sides for heat dissipation, thus the heat dissipation effect achieved by such flow direction is better than the heat dissipation effect achieved by traditional structures.

Further, in order to achieve a better sealing effect and avoid liquid leakage, a waterway sealing ring 213 is arranged on the outer periphery of the abutting surface between the waterway cover plate 21 and the radiation fin 1. The problem of liquid leakage of the radiation fin 1 and the main body is solved by arranging the waterway sealing ring 213.

Further, the semiconductor refrigeration structure 6 comprises a cooling conductive copper plate 61, an isolation sealing ring 62, a semiconductor refrigerator 63, an EVA foam 64 and a heat dissipation aluminum plate 65, wherein the cooling conductive copper plate 61 is arranged on the bottom surface of the water tank structure 2; the outer periphery of the cooling conductive copper plate 61 is sleeved with the isolation sealing ring 62; the side, away from the water tank structure 2, of the cooling conductive copper plate 61 is provided with the semiconductor refrigerator 63; the semiconductor refrigerator 63 abuts against the cooling conductive copper plate 61 and the outer periphery of the semiconductor refrigerator 63 is sleeved with the EVA foam 64; the heat dissipation aluminum plate 65 is arranged on the bottom surfaces of the semiconductor refrigerator 63 and the EVA foam 64, and the radiator fan assembly 7 is arranged under the heat dissipation aluminum plate. The semiconductor refrigerator 63 can quickly lower the water temperature of the main body water storage tank, and the EVA foam 64 can isolate and absorb water droplets generated by refrigeration. The heat dissipation aluminum plate 65 can absorb the semiconductor temperature generated by refrigeration.

Further, the side, away from the semiconductor refrigerator 63, of the heat dissipation aluminum plate 65 is provided with heat dissipation flaps 651; a water barrier wall 652 and a water return hole 653 are arranged between each adjacent heat dissipation flaps 651, and the water barrier walls 652 are arranged at the edge of the heat dissipation aluminum plate 65; the bottom of the water tank structure 2 is provided with a circle of return water storage tank 223, and the return water storage tank 223 is disposed at the outer periphery of the EVA foam 64; and the water return holes 653 correspond to the return water storage tank 223 above the heat dissipation aluminum plate 65 in position.

A circle of water barrier walls 652 and a circle of water return holes 653 are provided on the heat dissipation aluminum plate 65 to implement the function that: return water is liable to be produced by the heat dissipation aluminum plate 65 radiating the semiconductor, and the return water is blocked by the water barrier walls 652 when being generated on the heat dissipation aluminum plate 65 to flow into the return water storage tank 223 from the water return holes 653, and is finally absorbed by the EVA foam 64, thus undesirable phenomena caused by the return water flowing out is avoided.

Further, the radiator fan assembly 7 comprises a fan base 71, a fan 72 and an upper cover 73, wherein the fan 72 is installed in the upper cover 73; the annular fan base 71 is installed above the upper cover 73; the fan base 71 is sleeved outside the fan 72 and the semiconductor refrigeration structure 6 and is fixedly connected to the bottom surface of the water tank structure 2; the upper cover 73 is provided with air inlets 731, and the outer wall of the fan base 71 is provided with air outlets 711.

Further, a ventilation iron mesh 732 is arranged at the air inlets 731 of the upper cover 73, ventilation slots are formed on the outer wall of the fan base 71 at equal intervals, and the ventilation slots form the air outlets 711.

The fan structure assembly can dissipate the heat generated by semiconductor refrigeration for cooling, the fan takes in the air through the air inlets on the upper cover, and then discharges the air through the air outlets on the fan base, and finally, the air from the fan dissipates heat of and cools various electronic components such as an MOS tube and a memory bank around the main board CPU.

The fan may adopt one with colorful lights, and the lighting effect of the fan with colorful lights can be seen through upper openings and the air outlets on the side of the outer shell, so that the radiator is more beautiful and personalized.

According to the present invention, the bottom shell of the water pump structure can be connected to the water-cooled pipes with a three-section pagoda structure, which has tighter and firmer assembly to lower the risk of liquid leakage. An impeller of the water pump adopts a three-leaf water pumping structure, and water enters a bottom shell reservoir from the pipe on one side and sprays out from a middle hole, and then is sent to the pipe on the other side to flow out by means of the rotation of the impeller, so that the water supply efficiency is higher.

Heat dissipated by a CPU is transferred to the water tank by means of the radiation fin and absorbed by the coolant in the water tank, the coolant in the water tank is pumped out by the water pump to the water-cooled gear for heat dissipation, and then the coolant is sent back to the water tank for circularly cooling the CPU.

The present invention has the following characteristics:

1. According to the present invention, the water pump is arranged outside the water tank and externally disposed on the external water-cooled pipes. Compared with the traditional water-cooled devices with water pumps arranged inside water tanks, the storage space of the water tanks is increased, and therefore the refrigeration effect is improved.

2. According to the present invention, the radiation fin is stuck close to the outer end surface of a CPU, and the bottom surface of the radiation fin is provided with a water tank structure. The radiation fin is flushed by means of the water inlet channel disposed in the middle of the water tank structure, and water flows out toward both sides for heat dissipation, thus the heat dissipation effect achieved by such flow direction is better than the heat dissipation effect achieved by traditional structures.

3. According to the present invention, the lower end of the water tank structure is provided with a semiconductor refrigeration structure, which can rapidly lower the water temperature of a main body water storage tank, so that the temperature of the main board CPU is greatly lowered more effectively on the basis of the original refrigeration system.

4. According to the present invention, a radiator fan assembly is arranged under the semiconductor refrigeration structure, thus the heat generated by semiconductor refrigeration can be dissipated for cooling. And the fan can blow out the air all around from the inside of the water-cooled gear to the outside to dissipate heat of and cool various electronic components such as an MOS tube and a memory bank around the main board CPU when simultaneously dissipating heat of and cooling the semiconductor refrigerator.

Finally, it should be noted that the above embodiments are only used to illustrate the technical solutions of the present invention, but not to limit the present invention. Although the present invention has been described in detail with reference to the preferred embodiments, those of ordinary skill in the art should understand that the technical solutions of the present invention modified or equivalently replaced, without departing from the purpose and scope of the technical solution of the present invention, shall fall within the scope of the claims of the present invention.

The standard parts used in the present invention can be purchased from the market, the special-shaped parts can be customized according to the recording in the description and the drawings, the specific connection methods of each part adopt mature conventional methods such as bolts, rivets and welding in the prior art, the machinery, parts and devices all use conventional models in the prior art, and the circuit connection adopts conventional connection methods in the prior art, which won't dwell on herein.

In the description of the present invention, unless otherwise clearly specified and limited, the terms "installation", "linkage", "connection" and "fixation" shall be interpreted broadly, for example, it may be fixed connection or detachable connection or integrated connection, may be mechanical connection or electrical connection, may be direct connection or connection by means of an intermediate medium, and may be internal communication of two components or interaction relationship between two components. For those skilled in the art, the specific meaning of the above-mentioned terms in the present invention can be understood under specific circumstances.

The invention claimed is:

1. A water-cooled radiator internally provided with a semiconductor refrigeration system and a fan, comprising: a radiation fin, a water tank structure, water-cooled pipes, a water pump, a water-cooled gear, a semiconductor refrigeration structure and a radiator fan assembly, wherein the radiation fin is stuck close to the outer end surface of a CPU; the water tank structure is stuck close to the side, away from the CPU, of the radiation fin; the water tank structure is filled with coolant; the water tank structure is provided with a water inlet and a water outlet, and the water inlet and the water outlet are connected to the water-cooled gear by means of the water-cooled pipes; the water-cooled pipes outside the water tank structure are further provided with the water pump; and the water pump is used to form a water circulation with the coolant between the water tank structure and the water-cooled gear; and the semiconductor refrigeration structure is further fixedly installed on the side, away from the radiation fin, of the water tank structure; the radiator fan assembly is further arranged under the semiconductor refrigeration structure; and the radiation fin, the water tank structure, the semiconductor refrigeration structure and the radiator fan assembly are installed and connected from top to bottom to form an integrated structure.

2. The water-cooled radiator internally provided with the semiconductor refrigeration system and the fan according to claim 1, wherein the water-cooled pipes comprise a water inlet pipe, a water outlet pipe and adapters; the water tank structure is provided with a water inlet and a water outlet; the water inlet pipe is connected to the water inlet of the water tank structure, and the water outlet pipe is connected to the water outlet of the water tank structure; the adapters are arranged both between the water inlet pipe and the water inlet and between the water outlet pipe and the water outlet; and the water pump is disposed on the water inlet pipe or the water outlet pipe.

3. The water-cooled radiator internally provided with the semiconductor refrigeration system and the fan according to claim 2, wherein pipe sleeves are sleeved all outside the water inlet pipe, the water outlet pipe and the adapters.

4. The water-cooled radiator internally provided with the semiconductor refrigeration system and the fan according to claim 2, wherein a water pump vibration-absorbing sleeve is further sleeved outside the water pump.

5. The water-cooled radiator internally provided with the semiconductor refrigeration system and the fan according to claim 2, wherein the water tank structure comprises a waterway cover plate and a main body bottom shell, wherein a water inlet tank and water outlet tanks are arranged in the main body bottom shell; the water inlet tank is disposed in the middle of the main body bottom shell, and the water outlet tanks are disposed on the left and right sides of the water inlet tank and communicate with each other; the water inlet tank communicates with the water inlet, and the water outlet tanks communicate with the water outlet; the waterway cover plate is installed on the main body bottom shell in a closed manner; a water inlet channel is formed in the middle of the waterway cover plate, and water outlet channels are formed on the left and right sides of the waterway cover plate; the water inlet channel and the water inlet tank are arranged correspondingly, and the water outlet channels and the water outlet tanks are arranged correspondingly; and the side, away from the main body bottom shell, of the waterway cover plate abuts against the radiation fin.

6. The water-cooled radiator internally provided with the semiconductor refrigeration system and the fan according to claim 5, wherein a waterway sealing ring is arranged on the outer periphery of the abutting surface between the waterway cover plate and the radiation fin.

7. The water-cooled radiator internally provided with the semiconductor refrigeration system and the fan according to claim 1, wherein the semiconductor refrigeration structure comprises a cooling conductive copper plate, an isolation sealing ring, a semiconductor refrigerator, an EVA foam and a heat dissipation aluminum plate, wherein the cooling conductive copper plate is arranged on the bottom surface of the water tank structure; the outer periphery of the cooling conductive copper plate is sleeved with the isolation sealing ring; the side, away from the water tank structure, of the cooling conductive copper plate is provided with the semiconductor refrigerator; the semiconductor refrigerator abuts against the cooling conductive copper plate and the outer periphery of the semiconductor refrigerator is sleeved with the EVA foam; the heat dissipation aluminum plate is arranged on the bottom surfaces of the semiconductor refrigerator and the EVA foam; and the radiator fan assembly is arranged under the heat dissipation aluminum plate.

8. The water-cooled radiator internally provided with the semiconductor refrigeration system and the fan according to claim 7, wherein the side, away from the semiconductor refrigerator, of the heat dissipation aluminum plate is provided with heat dissipation flaps; a water barrier wall and a water return hole are arranged between each adjacent heat dissipation flaps, and the water barrier walls are arranged at the edge of the heat dissipation aluminum plate; the bottom of the water tank structure is provided with a circle of return water storage tank, and the circle of return water storage tank is arranged at the outer periphery of the EVA foam; and the water return holes correspond to the return water storage tank above the heat dissipation aluminum plate in position.

9. The water-cooled radiator internally provided with the semiconductor refrigeration system and the fan according to claim 1, wherein the radiator fan assembly comprises a fan base, a fan and an upper cover, wherein the fan is installed in the upper cover; the annular fan base is installed on the upper cover; the fan base is sleeved outside the fan and the semiconductor refrigeration structure and is fixedly connected to the bottom surface of the water tank structure; the upper cover is provided with air inlets, and the outer wall of the fan base is provided with air outlets.

10. The water-cooled radiator internally provided with the semiconductor refrigeration system and the fan according to claim 9, wherein a ventilation iron mesh is arranged at the air inlets of the upper cover, ventilation slots are formed on the outer wall of the fan base at equal intervals, and the ventilation slots form the air outlets.

\* \* \* \* \*